United States Patent
Yu et al.

(10) Patent No.: US 11,959,962 B2
(45) Date of Patent: Apr. 16, 2024

(54) INTEGRATED CIRCUIT PACKAGE WITH INTERNAL CIRCUITRY TO DETECT EXTERNAL COMPONENT PARAMETERS AND PARASITICS

(71) Applicant: QUALCOMM Incorporated, San Diego, CA (US)

(72) Inventors: Chengyue Yu, San Diego, CA (US); Hua Guan, San Diego, CA (US); Yingjie Chen, Atlanta, GA (US); Fan Yang, Singapore (SG); Yufei Pan, Singapore (SG); Jize Jiang, Singapore (SG); Shamim Ahmed, Mesa, AZ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/808,357

(22) Filed: Jun. 23, 2022

(65) Prior Publication Data
US 2023/0417828 A1 Dec. 28, 2023

(51) Int. Cl.
*G01R 31/28* (2006.01)

(52) U.S. Cl.
CPC ..... *G01R 31/2896* (2013.01); *G01R 31/2853* (2013.01); *G01R 31/2891* (2013.01)

(58) Field of Classification Search
CPC ............. G06F 3/044; G06F 2213/0016; G06F 2113/18; H01L 2924/3011; H01L 2924/14;
(Continued)

(56) References Cited

U.S. PATENT DOCUMENTS 7,215,132 B2 * 5/2007 Yokota ................... G01R 31/71
324/763.01
7,511,507 B2 * 3/2009 Hatagami .......... G01R 31/2884
438/18
(Continued)

FOREIGN PATENT DOCUMENTS

CN     1173233 A    2/1998
CN   205427011 U   8/2016
EP    2464008 A1   6/2012

OTHER PUBLICATIONS

Partial International Search Report—PCT/US2023/067282—ISA/EPO—Nov. 13, 2023.
(Continued)

*Primary Examiner* — Vinh P Nguyen
(74) *Attorney, Agent, or Firm* — Patterson + Sheridan, L.L.P.

(57) ABSTRACT

Apparatus and techniques for an integrated circuit (IC) package to automatically detect, through an input/out pin, external component parameters and parasitics. An example IC package generally includes a pin for coupling to a component external to the IC package, and at least one of a resistance detector, an inductance detector, or a capacitance detector coupled to the pin, and configured to detect at least one of a resistance, an inductance, or a capacitance, respectively, of a lumped parameter model for the component external to the IC package. The resistance detector, inductance detector, or capacitance detector may also be configured to detect parasitics associated with at least one of the component, the pin, or a connection between the component and the pin.

32 Claims, 7 Drawing Sheets

(58) Field of Classification Search
CPC ......... H01L 23/481; H01L 2924/30105; H01L 24/80; H01L 2223/6644; H01L 23/48; H01L 23/645; H01L 23/642; H01L 22/34; H01L 23/538; H01L 27/101; G01R 27/2605; G01R 19/0092; G01R 27/16; G01R 15/146; G01R 19/0084; G01R 31/2896; G01R 31/312; G01R 1/203; G01R 27/14; G01R 31/54; G01R 31/318555; G01R 31/71; G01R 31/31724; G01R 31/31701; G01R 31/2851; G01R 31/316; G01R 31/68; G01R 31/64

See application file for complete search history.

(56) References Cited

U.S. PATENT DOCUMENTS

| | | | | |
|---|---|---|---|---|
| 9,500,692 | B2* | 11/2016 | Hsu | H03K 19/20 |
| 9,521,712 | B1* | 12/2016 | Melanson | G01R 27/14 |
| 9,641,070 | B2* | 5/2017 | Wibben | H02M 3/156 |
| 2004/0059528 | A1 | 3/2004 | Sutardja | |
| 2019/0219452 | A1 | 7/2019 | Hayes et al. | |

OTHER PUBLICATIONS

International Search Report and Written Opinion—PCT/US2023/067282—ISA/EPO—Feb. 8, 2024.

\* cited by examiner

700

702

COUPLE AT LEAST ONE OF A RESISTANCE DETECTOR, AN INDUCTANCE DETECTOR, OR A CAPACITANCE DETECTOR, INTERNAL TO AN INTEGRATED CIRCUIT (IC) PACKAGE, TO A PIN OF THE IC PACKAGE, THE PIN BEING COUPLED TO A COMPONENT EXTERNAL TO THE IC PACKAGE

704

DETECT, USING THE AT LEAST ONE OF THE RESISTANCE DETECTOR, THE INDUCTANCE DETECTOR, OR THE CAPACITANCE DETECTOR INTERNAL TO THE IC PACKAGE, AT LEAST ONE OF A RESISTANCE, AN INDUCTANCE, OR A CAPACITANCE, RESPECTIVELY, OF A LUMPED PARAMETER MODEL FOR THE COMPONENT EXTERNAL TO THE IC PACKAGE AND FOR PARASITICS ASSOCIATED WITH AT LEAST ONE OF THE COMPONENT, THE PIN, OR A CONNECTION BETWEEN THE COMPONENT AND THE PIN

FIG. 7

INTEGRATED CIRCUIT PACKAGE WITH INTERNAL CIRCUITRY TO DETECT EXTERNAL COMPONENT PARAMETERS AND PARASITICS

TECHNICAL FIELD

Certain aspects of the present disclosure generally relate to electronic circuits and, more particularly, to an integrated circuit package having an on-chip detection scheme for one or more off-chip components and parasitics.

BACKGROUND

Electronic devices, such as computers, wireless communications devices (e.g., cellular phones and Wi-Fi access points), and wearable devices, have come into widespread use in recent years. The electronic devices typically include one or more integrated circuits (ICs). These ICs are typically implemented as one or more semiconductor dies that may be coupled to other electronic components, all of which may be included in an IC package for assembly on a printed circuit board (PCB), for inclusion in an electronic device.

Packaging integrated circuit dies and other components together in modules (also referred to herein as "packaged assemblies") may enable electronic devices to have a smaller form factor while providing improved signal performance (e.g., reduced transient overshoot and undershoot), electrical performance (e.g., reduced power consumption), and thermal performance (e.g., reduced heat generation), as compared to previously known electronic devices. For example, a cell phone may have improved battery life due to a reduction in power consumed by a transceiver module in which dies and other components are assembled in a packaged assembly.

SUMMARY

The systems, methods, and devices of the disclosure each have several aspects, no single one of which is solely responsible for its desirable attributes. Without limiting the scope of this disclosure as expressed by the claims that follow, some features will now be discussed briefly. After considering this discussion, and particularly after reading the section entitled "Detailed Description," one will understand how the features of this disclosure provide the advantages described herein.

Certain aspects of the present disclosure generally relate to apparatus and techniques for an integrated circuit (IC) package to detect external component parameters and parasitics.

Certain aspects of the present disclosure are directed to an integrated circuit (IC) package. The IC package generally includes a pin for coupling to a component external to the IC package, and at least one of a resistance detector, an inductance detector, or a capacitance detector coupled to the pin and configured to detect at least one of a resistance, an inductance, or a capacitance, respectively, of a lumped parameter model for the component external to the IC package and for parasitics associated with at least one of the component, the pin, or a connection between the component and the pin.

Certain aspects of the present disclosure are directed to a method for parameter determination. The method generally includes coupling at least one of a resistance detector, an inductance detector, or a capacitance detector, internal to an integrated circuit (IC) package, to a pin of the IC package, the pin being coupled to a component external to the IC package. The method also includes detecting, using the at least one of the resistance detector, the inductance detector, or the capacitance detector internal to the IC package, at least one of a resistance, an inductance, or a capacitance, respectively, of a lumped parameter model for the component external to the IC package and for parasitics associated with at least one of the component, the pin, or a connection between the component and the pin.

Certain aspects of the present disclosure are directed to an integrated circuit (IC) package. The IC package generally includes a pin for coupling to a component external to the IC package, and at least one of means for detecting resistance, means for detecting inductance, or means for detecting capacitance, of a lumped parameter model for the component external to the IC package and for parasitics associated with at least one of the component, the pin, or a connection between the component and the pin.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 7 is a flow diagram of example operations for parameter determination, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure provide circuitry and techniques for an integrated circuit (IC) package to automatically detect external component parameters and parasitics, the circuitry being internal to the IC package. Such circuitry and techniques may allow design parameters of the IC package to be adaptively changed based on the detected external parameters and parasitics.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Device

Figure 1:
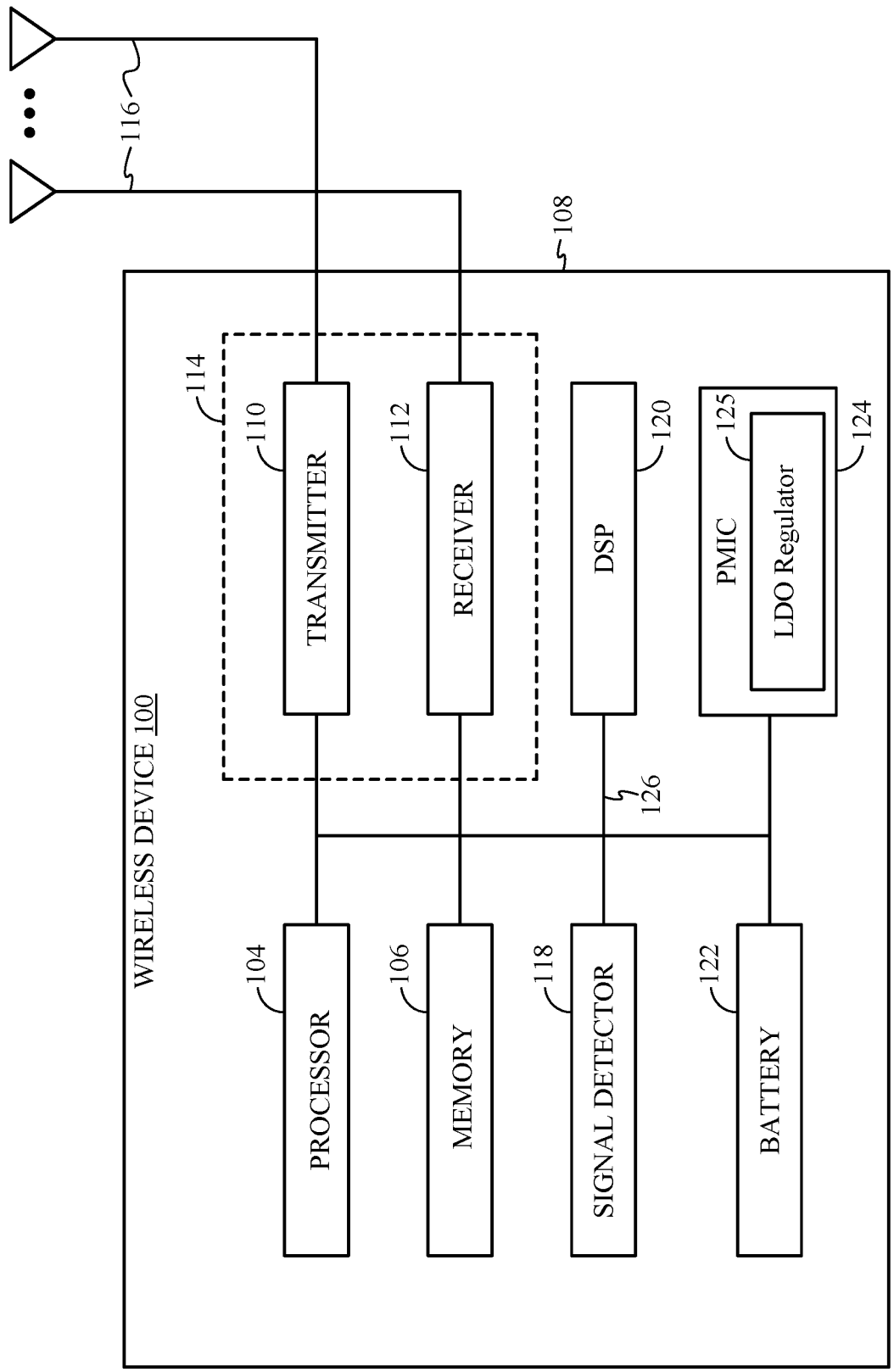
FIG. 1 illustrates a block diagram of an example device, in which aspects of the present disclosure may be implemented.

FIG. 1 illustrates an example device 100 in which aspects of the present disclosure may be implemented. The device 100 may be a battery-operated device such as a cellular phone, a personal digital assistant (PDA), a handheld device, a wireless device, a laptop computer, a tablet, a smartphone, a wearable device, etc.

The device 100 may include a processor 104 that controls operation of the device 100. The processor 104 may also be referred to as a central processing unit (CPU). Memory 106, which may include both read-only memory (ROM) and random access memory (RAM), provides instructions and data to the processor 104. A portion of the memory 106 may also include non-volatile random access memory (NVRAM). The processor 104 typically performs logical and arithmetic operations based on program instructions stored within the memory 106.

In certain aspects, the device 100 may also include a housing 108 that may include a transmitter 110 and a receiver 112 to allow transmission and reception of data between the device 100 and a remote location. For certain aspects, the transmitter 110 and receiver 112 may be combined into a transceiver 114. One or more antennas 116 may be attached or otherwise coupled to the housing 108 and electrically connected to the transceiver 114. The device 100 may also include (not shown) multiple transmitters, multiple receivers, and/or multiple transceivers.

The device 100 may also include a signal detector 118 that may be used in an effort to detect and quantify the level of signals received by the transceiver 114. The signal detector 118 may detect such signal parameters as total energy, energy per subcarrier per symbol, and power spectral density, among others. The device 100 may also include a digital signal processor (DSP) 120 for use in processing signals.

The device 100 may further include a battery 122 used to power the various components of the device 100. The device 100 may also include a power management integrated circuit (power management IC or PMIC) 124 for managing the power from the battery to the various components of the device 100. The PMIC 124 may perform a variety of functions for the device such as DC-to-DC conversion, battery charging, power-source selection, voltage scaling, power sequencing, etc. In certain aspects, the PMIC 124 may include at least a portion of a power supply circuit, which may include a switched-mode power supply (SMPS) or a linear voltage regulator, such as a low dropout (LDO) regulator 125.

The device 100 may additionally include one or more speakers (not shown) for transducing electrical signals into audio signals. In this case, the device 100 may include one or more amplifiers for driving the speaker(s), and these amplifiers may be powered by one or more power supply circuits, which may be part of the PMIC or receive power supply voltage rails generated by the PMIC.

The various components of the device 100 may be coupled together by a bus system 126, which may include a power bus, a control signal bus, and/or a status signal bus in addition to a data bus.

Figure 2:
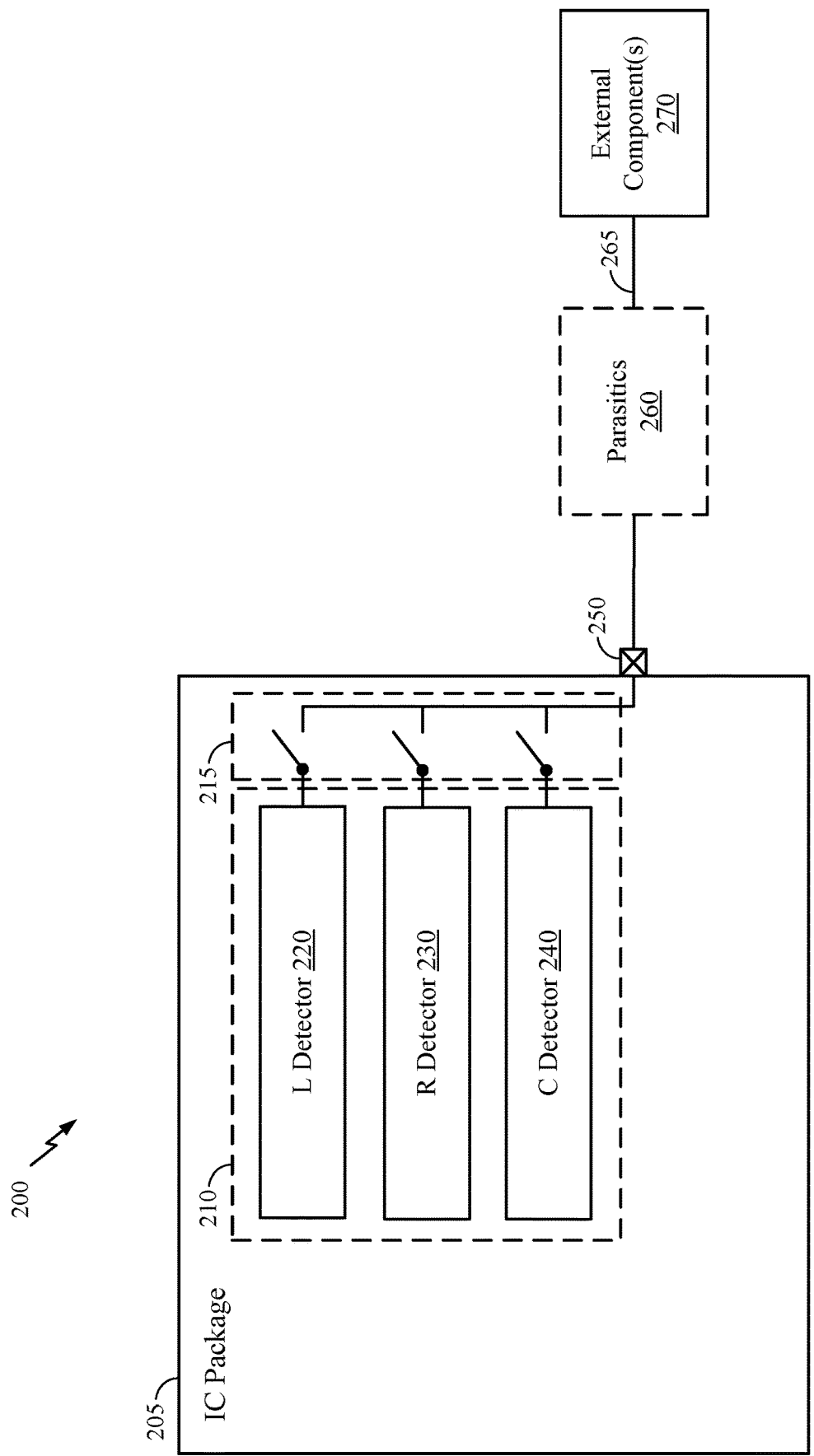
FIG. 2 is a block diagram of an example circuit comprising an integrated circuit (IC) package and one or more external components, in accordance with certain aspects of the present disclosure.

Example IC Package Supporting Internal Inductance, Capacitance, and/or Resistance Detection of External Components FIG. 2 is a block diagram of an example circuit 200 including an integrated circuit (IC) package 205, in which aspects of the present disclosure may be implemented. The IC package 205 may have a pin 250 (e.g., an input/output (I/O) pin) for coupling the IC package 205 to one or more external component(s) 270 (i.e., component(s) outside the IC package).

Many circuits (such as the circuit 200) are not fully on-chip (e.g., internal to a single IC package, such as the IC package 205), and instead include pin(s) (such as the pin 250) for coupling the IC package to external component(s) (such as the external component(s) 270). The entire circuit may be implemented on a printed circuit board (PCB). In some cases, external components and parasitics (e.g., of the pin, the PCB, and/or the external components themselves) can introduce additional variables for consideration when designing a circuit. Accordingly, a single circuit design may not be able to achieve optimized performance for all conditions under which the circuit may be operated. Therefore, automatic detection, determination, and/or measurement of component parameters and parasitics is desirable so that automatic configuration of the IC package may be enabled.

Some aspects of circuit design may be adaptively configured using programmable components. However, although some components in circuits may be programmable, adding programmable components generally involves performing additional circuit testing and tuning. Additionally, although frequency-domain measurement tools exist, frequency-domain measurements of parasitics and component parameter(s) are generally complex and consume additional power and real estate, which may make such implementations impractical or not feasible.

One approach to detecting external parasitics and component parameters involves using a sensor in the IC package coupled to the external component(s) through one or more sensing pins separate from an input/output pin of an IC package. However, this design includes additional pins and routing resources, which may be costly and difficult to integrate. Moreover, such sensors may not really be designed for measuring external passive component parameters and parasitics, and may therefore not be reliable in such applications.

Therefore, certain aspects of the present disclosure provide techniques and internal circuitry for detecting external parasitics and component parameters through the input/output pin of an IC package, without any extra sensing pins or sensor interface. This detection scheme may be performed automatically for certain aspects (e.g., during power-up of the IC package or during other blank times of the IC package's operation).

Accordingly, as shown in FIG. 2, the IC package 205 may also include internal detection circuitry 210 for detecting external component parameters and parasitics through the pin 250. The detection circuitry 210 may include one or more of an inductance detector 220, a resistance detector 230, and a capacitance detector 240. The IC package 205 may optionally include a switch network 215 comprising one or more switches coupled between the pin 250 and at least one of the inductance detector 220, the resistance detector 230, or the capacitance detector 240. The switches may allow the detector(s) to be connected to the pin 250 when a particular detector is being used and to be disconnected from the pin 250 during mission mode of the IC package circuitry normally associated with the pin 250.

The inductance detector 220, the resistance detector 230, and/or the capacitance detector 240 may be configured to detect at least one of an inductance, a resistance, or a capacitance, respectively, of a lumped parameter model (e.g., lumped parameter model 328 shown in FIGS. 3, 5, and 6, also known as a "lumped element model") for the external component(s) 270. The inductance detector 220, the resistance detector 230, and/or the capacitance detector 240 may be configured to detect parasitics 260 associated with at least one of the external component(s) 270, the pin 250, or a connection 265 (e.g., routing) between the external component(s) 270 and the pin 250 (e.g., due to PCB construction, vias, and/or trace routing).

Based on the detected inductance, resistance, and/or capacitance of the lumped parameter model, one or more parameters may be selected (e.g., tunings or settings for adjustable components in the IC package and/or other circuits) and one or more components may be adjusted based on the selected parameters (i.e., adaptive parameter selection). Such detection and selection may save testing, debugging, and/or calibration time and non-recurring engineering (NRE) costs. Furthermore, knowing the inductance, resistance, and/or capacitance looking out of the pin 250 and selecting parameters accordingly may improve various performance specifications, may increase stability margins, and avoid overdesign.

Although the inductance detector 220, the resistance detector 230, or the capacitance detector 240 are depicted as being separate detectors, a person of ordinary skill in the relevant art will appreciate that some components in one of the detectors may be used by one or more of the other detectors to perform the respective detection processes described in more detail below. For example, the resistance detector 230 and the capacitance detector 240 may be combined and may share components, in some instances.

In some aspects, at least one of the inductance detector 220, the resistance detector 230, or the capacitance detector 240 may be configured to operate in the time domain. For example, in some aspects, at least one of the detectors may be configured to output a time-domain drive signal (e.g., to the external component(s) 270), and to sense a time-domain response signal (e.g., from the external component(s) 270). The drive signal and the response signal may be used to determine at least one of the inductance, the resistance, or the capacitance of the lumped parameter model for the external component(s) 270, as explained in more detail below.

Example Inductance Detection Circuitry

Figure 3:
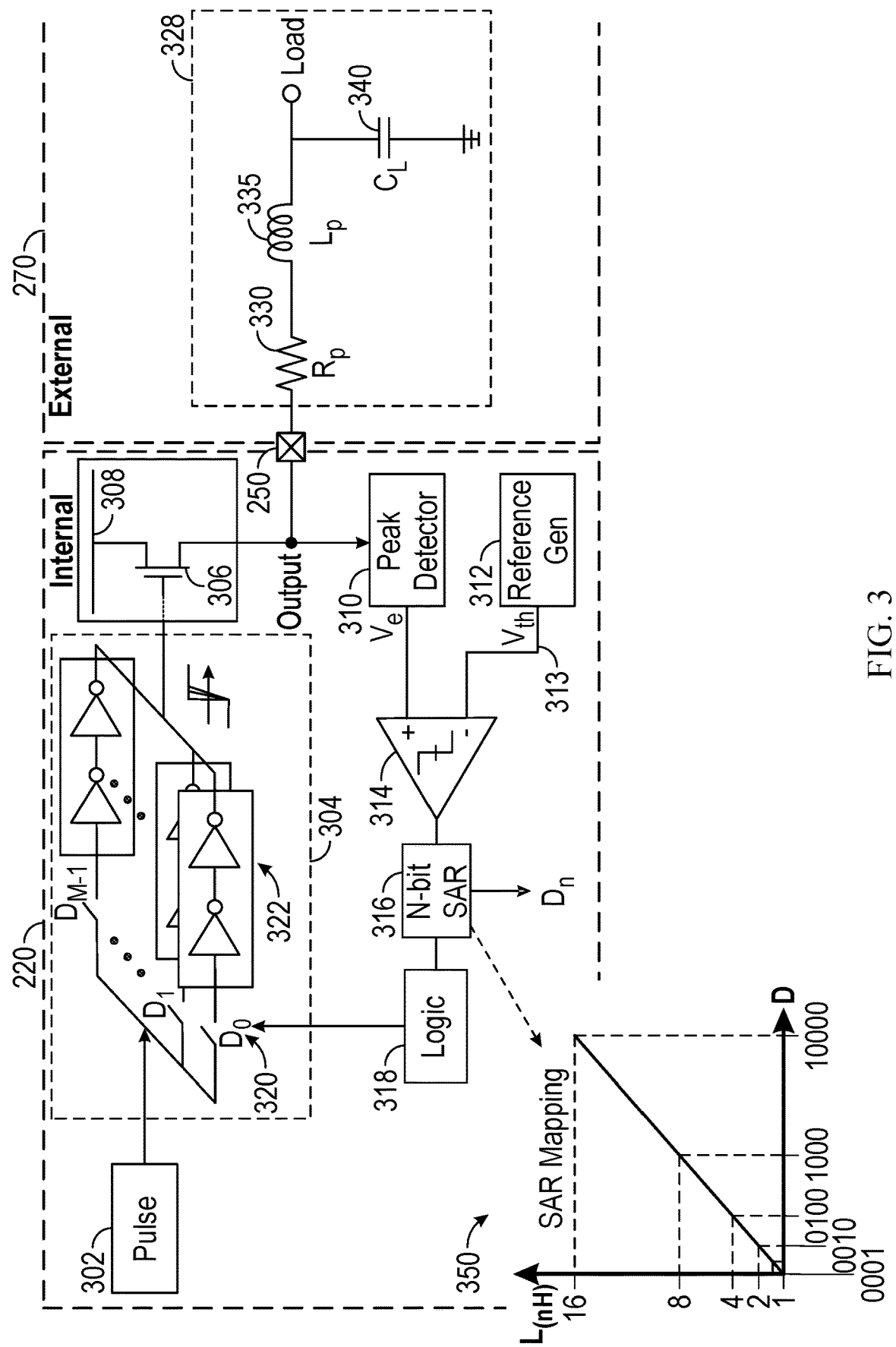
FIG. 3 illustrates an example implementation of an inductance detector, in accordance with certain aspects of the present disclosure.

FIG. 3 illustrates an example implementation of the inductance detector 220, in accordance with certain aspects of the present disclosure. As shown, the external component(s) 270 may be represented using a lumped parameter model 328, which may include a series resistor 330 with resistance $R_p$, a series inductor 335 with inductance $L_p$, and a shunt capacitor 340 with capacitance $C_L$. The inductance detector 220 may be configured to determine the inductance $L_p$ of the inductor 335 in the lumped parameter model.

The inductance detector 220 may include a pulse generator 302, a switch driver 304, and a switch 306. The switch 306 may be coupled between a power supply rail 308 and the pin 250, and the switch driver 304 may be coupled between an output of the pulse generator 302 and a control input of the switch 306 (e.g., a gate of a transistor implementing the switch 306).

In some aspects, the switch driver 304 may be configured to drive the switch 306 with multiple different slew rates (where "slew rate" generally refers to a change in voltage or current per unit of time). Therefore, in some aspects, the switch driver 304 may include a plurality of drive circuits 322 selectively coupled, via switches 320 (labeled "$D_0$, $D_1$, . . . , $D_{M-1}$" and also representing the digital control signals for the switches), between the output of the pulse generator 302 and the control input of the switch 306. In some aspects, at least one of the plurality of drive circuits 322 may be implemented as a plurality of series-connected inverters (as shown), a plurality of series-connected buffers, or a combination thereof. The paths associated with each drive circuit 322 may sometimes be referred to individually as a "switch driver path," and collectively as "switch driver paths." Each drive circuit 322 may have a different delay, which may be implemented by having a different number of inverters and/or buffers in each drive circuit. By having different driving strength in each of the drive circuits 322, the different switch driver paths may be configured to drive the switch 306 with control signals (e.g., pulses from the pulse generator 302) having different slew rates.

According to certain aspects, the inductance detector 220 may further include a peak detector 310, a comparator 314, an N-bit successive approximation register (SAR) 316, and digital logic 318. The peak detector 310 may have an input coupled to the pin 250 and to the switch 306. As shown, the comparator 314 may have a first input coupled to an output of the peak detector 310 and a second input coupled to a reference voltage node 313. For certain aspects, the reference voltage node 313 may be coupled to a reference voltage generator 312, which may generate the reference voltage (labeled "$V_{th}$") using any of various suitable techniques. The output of the comparator 314 may be coupled to the input of the SAR 316, and the output of the SAR 316 may be coupled to the logic 318. For the N-bit SAR 316, N is the number of cycles through the inductance detector 220 and represents the inductance resolution.

The inductance detector 220 may determine the inductance L p of the inductor 335 using a SAR-based charging scheme according to the equation for the instantaneous voltage $V_L$ across an inductor. Thus, the inductance detection may be based on introducing current with different slew rates to the pin 250 and detecting the resulting peak voltages ($V_e$) across the inductor 335 with the peak detector 310. The voltage $V_L$ may be represented by the equation $$V_e = L_p * \frac{dI_L}{dt}$$

where $$\frac{dI_L}{dt}$$

is the change in current across the inductor over time (a slew rate). With higher frequency slew rates, the DC component (resistance) and the capacitance of the lumped parameter model 328 may be negligible, such that the sensed voltage represents the inductance of the lumped parameter model 328.

By using this equation and setting $$\frac{dI_L}{dt}$$

to a very large value (e.g., using fast rise times for pulses received at the control input of the switch 306), the inductance $L_p$ becomes detectable based on the measured voltage $V_e$, even if the inductance $L_p$ is very small. For example, in some cases the inductance $L_p$ may be in the nanohenry (nH) range. The various slew rates from the different switch driver paths allow the time (dt) over which the current is driven to the inductor 335 to be changed depending on which switch driver path is selected.

The inductance detector 220 may function by successively using different switch driver paths to achieve different peak voltages at the pin 250, based on values stored in the SAR 316 and the encoding of the logic 318 for selecting the next switch driver path. The peak detector 310 may be configured to detect the peak voltages, and the comparator 314 may be configured to compare the peak voltages to a reference voltage (also referred to as a "threshold voltage" and accordingly labeled "$V_{th}$") generated by the reference voltage generator 312. In some examples, the reference voltage may be designed to be equal to half of a voltage of a pulse from the pulse generator 302 (e.g., a midpoint of the highest possible peak voltage value). The comparator 314 is configured to compare the peak voltage to the reference voltage in each iteration (each cycle). If the comparator 314 determines that the peak voltage is less than the threshold voltage, the comparator will output a logic "0." If the comparator 314 determines that the peak voltage is more than the threshold voltage, the comparator will output a logic "1."

The SAR 316 may be configured to store (and shift) the 1-bit value from the comparator 314 based on each of N comparisons performed. The logic 318 may have one or more outputs coupled to control inputs of the switches 320 in the switch driver 304. The logic 318 may be configured to control selection of the switch driver paths based on a digital value in the SAR 316. Specifically, the logic 318 may serve to control the switches 320 based on a mapping of the bits of the SAR 316 to the switches 320.

At the end of N cycles through the inductance detector 220, the selected switch driver path should lead to the peak voltage on the pin 250 approaching the reference voltage, which indicates the SAR-based quantization of external inductance has been successfully completed. After N cycles, the N-bit value stored in the SAR 316 may be used to determine the inductance, based on the mapping of inductance to digital codes, for example, as illustrated in the graph 350 where N=4 cycles. For example, a SAR output of 0101b may indicate an inductance of about 5 nH. The driving strength in the drive circuits 322 may be designed to provide a linear mapping of inductance to digital codes, such as the linear relationship illustrated in the graph 350.

Figure 4:
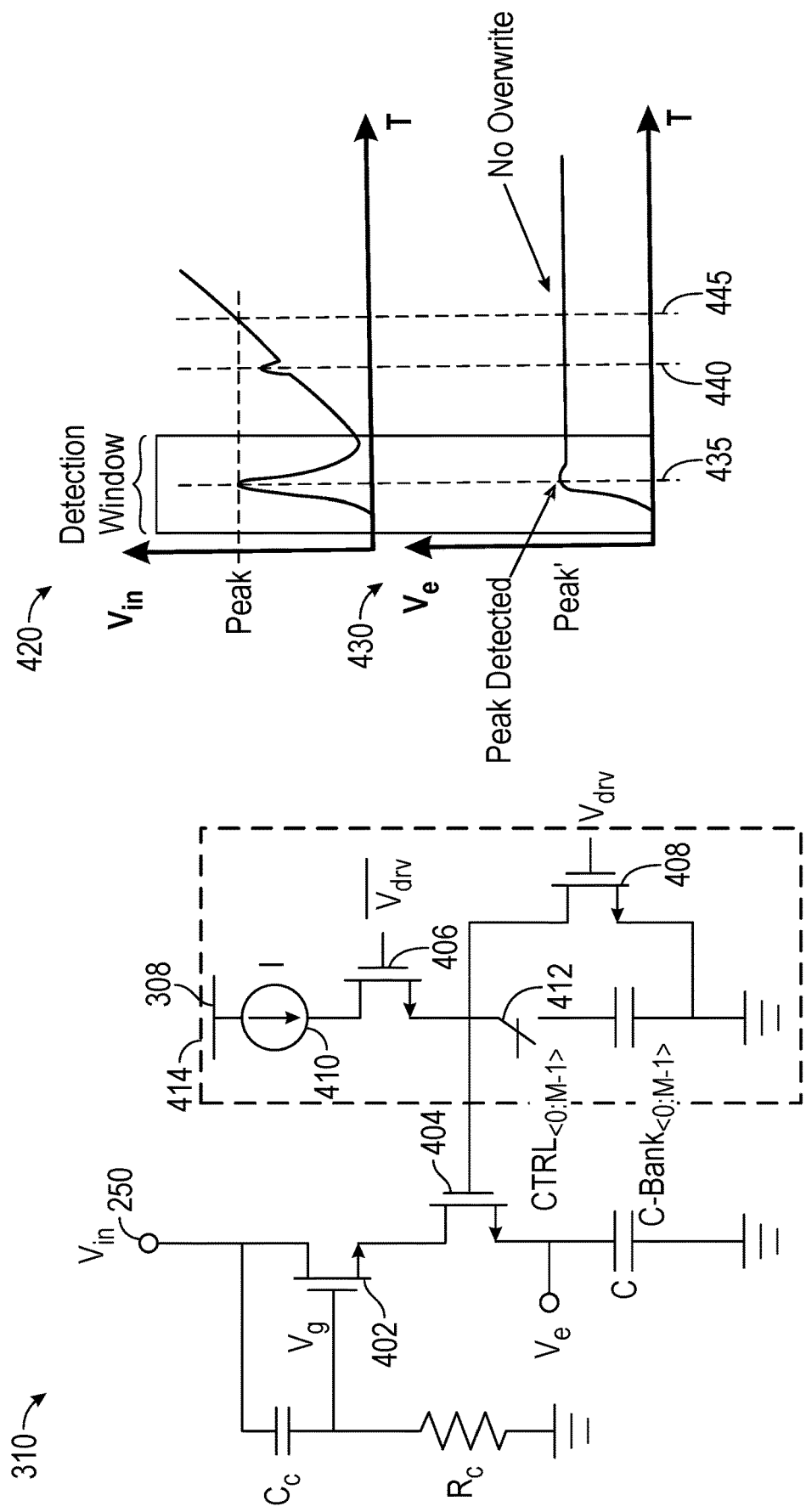
FIG. 4 illustrates an example implementation of an example peak detector, in accordance with certain aspects of the present disclosure.

FIG. 4 illustrates an example implementation of the peak detector 310, in accordance with certain aspects of the present disclosure. With the detection scheme above, the voltage across the inductor 335 may be effectuated as a very short pulse in each cycle. The peak detector 310 may be configured to capture and hold the peak voltage of the short pulse.

The peak detector 310 may include a first transistor 402 having a drain coupled to the pin 250 and a first capacitive element C. The first capacitive element C may be coupled between a source of the first transistor 402 and a reference potential node (e.g., electrical ground) of the peak detector 310. If the gate and drain of the first transistor 402 were connected together, the first transistor would be a diode-connected transistor, such that the peak detector would effectively include a series diode coupled to a shunt capacitor (e.g., the first capacitive element C), where the output of the peak detector would be the cathode of the diode (e.g., the source of the first transistor 402). Accordingly the first capacitive element C may be configured to charge when the voltage at the pin 250 is greater than the voltage across the first capacitive element C, and may be configured to stop charging when the voltage at the pin 250 is less than the voltage across the first capacitive element C. In this manner, the first capacitive element C may be configured to detect and hold a peak voltage value at the pin 250 during a detection window.

According to certain aspects, the peak detector 310 may be implemented as an AC-coupled diode peak detector, as shown. In this case, the peak detector 310 may include a second capacitive element Cc coupled between the drain and the gate of the first transistor 402. The second capacitive element Cc may prevent reverse leakage from DC signals being coupled to the pin 250. The peak detector 310 may also include a resistive element $R_C$ coupled between the gate of the first transistor 402 and the reference potential node.

In some aspects, the peak detector 310 may also include a second transistor 404 having a drain coupled to the source of the first transistor 402. The source of the second transistor 404 may be coupled to the first capacitive element C and to the first input of the comparator 314 (e.g., at the node labeled "$V_e$," also referred to as the output of the peak detector 310). The second transistor 404 may function as an isolation switch configured to isolate supply ripple and leakage from the pin 250.

The peak detector 310 may also include control logic circuitry 414 for the second transistor 404, which may include a third transistor 406, a fourth transistor 408, a current source 410, and a switched capacitor array (also referred to as a "capacitor bank"). The switched capacitor array may be implemented by M parallel paths, each path including a switch 412 coupled in series with a capacitive element (labeled "C-Bank$_{<0:M-1>}$"). For certain aspects, M=$2^N$. A source of the third transistor 406 may be coupled to a gate of the second transistor 404. The current source 410 may be coupled between the power supply rail 308 and a drain of the third transistor 406. The fourth transistor 408 may have a drain coupled to the gate of the second transistor 404 and to the source of the third transistor 406, and may have a source coupled to the reference potential node of the peak detector 310. In some aspects, the control input signals (labeled "Vary" and "Vary") of the third transistor 406 and the fourth transistor 408 may be complementary signals. The control logic circuitry 414 may be configured to activate the second transistor 404 at the start of a detection window, and to deactivate the second transistor 404 at the end of the detection window. In some examples, the detection window may begin when a new switch driver path is selected and a new pulse is generated.

In some aspects, the switched capacitor array may be coupled between the gate of the second transistor 404 and the reference potential node of the peak detector 310. The switched capacitor array may be used to control the turn-off timing of the second transistor 404. The capacitive element C-Bank$_{<0:M-1>}$ in the switched capacitor array may be selected—using the control signals (labeled "CTRL$_{<0:M-1>}$") for the switches 412—based on the switch driver path (and corresponding slew rate) selected. For example, the faster the slew rate of the selected switch driver path, the smaller the turn-on time of the peak detector 310 will be. In that case, the switched capacitor array may be selected to have a smaller capacitance. This may serve to minimize (or at least reduce) the supply ripple impact of the voltage held on the peak detector 310.

Graphs 420 and 430 illustrate an example input signal and output signal, respectively, of the peak detector 310. The input signal of the peak detector 310 (represented by the y-axis and labeled "Vin" in the graph 420) may be a return signal received at the pin 250 from the external components, and the output signal of the peak detector 310 (represented by the y-axis and labeled "$V_e$" in the graph 430) may indicate a detected peak voltage of the input signal during a detection window. In the illustrated example, at a time 435 during the detection window, the input signal spikes to a peak value (labeled "Peak"), and the peak detector 310 detects the peak value and holds the value (e.g., as a stored value Peak'). Even if ripple voltage occurs at the input of the peak detector 310, as illustrated in the graph 420 at a time 440, the output of the peak detector 310 will not change. Additionally, if the input signal exceeds the peak voltage at a time 445 that is outside of the detection window, the peak detector 310 will hold (e.g., not overwrite) the held peak value that was detected during the detection window.

Example Resistance Detection Circuitry

Figure 5:
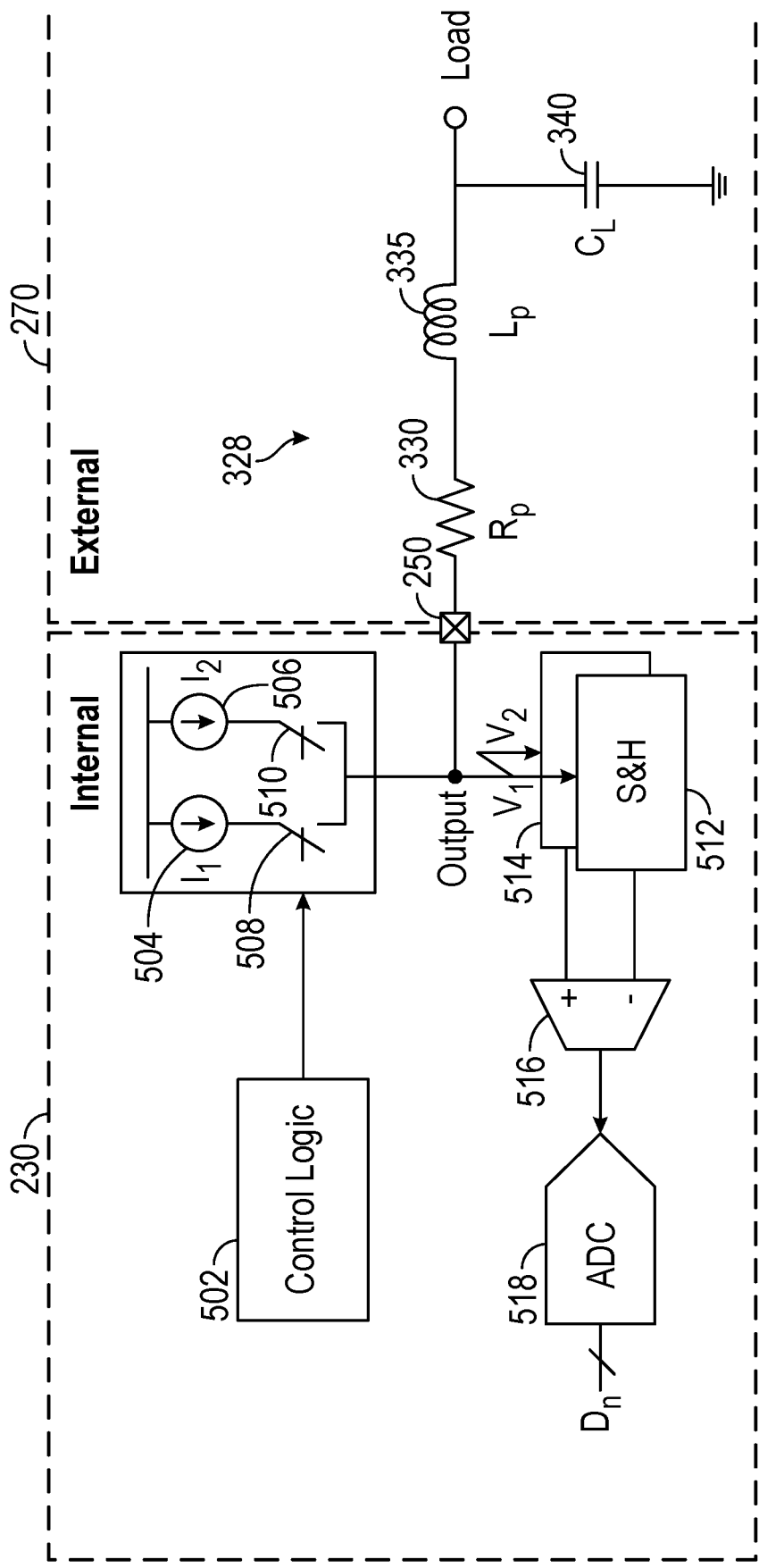
FIG. 5 illustrates an example implementation of a resistance detector, in accordance with certain aspects of the present disclosure.

FIG. 5 illustrates an example resistance detector 230, in accordance with certain aspects of the present disclosure. The resistance detector 230 may be configured to determine a resistance $R_p$ of the resistor 330 in the lumped parameter model 328.

The resistance detector 230 may include control logic 502, a first current source 504 configured to source a first current (labeled "$I_1$"), a first switch 508 coupled between the first current source 504 and the pin 250, a second current source 506 configured to source a second current (labeled "$I_2$"), and a second switch 510 coupled between the second current source 506 and the pin 250. The second current should be different from the first current. The first current source 504 may be coupled between a power supply rail (e.g., power supply rail 308) and the first switch 508, and the second current source 506 may be coupled between the power supply rail and the second switch 510. The first current source 504, the second current source 506, the first switch 508, and/or the second switch 510 may each be implemented by one or more transistors, for example. The resistance detector 230 may further include a first sample-and-hold (S&H) circuit 512 having an input coupled to the pin 250, a second S&H circuit 514 having an input coupled to the pin 250, and an analog-to-digital converter (ADC) 518 having one or more inputs coupled to an output of the first S&H circuit 512 and to an output of the second S&H circuit 514.

The resistance detector 230 (and more specifically, the control logic 502) may be configured to close the first switch 508 at a beginning of a first period to provide the first current from the first current source 504 to the pin 250. The first period may have a time length $t_1$. Providing the first current to the pin 250 may generate a resistor voltage across one or more external resistive elements (represented by the resistor 330) and charge one or more external capacitive elements (e.g., represented by the capacitor 340) to generate a capacitor voltage. This charging may be performed at low frequencies, such that the DC component and capacitive element dominate, and the inductive element in the lumped parameter model 328 has negligible effect (e.g., little to no voltage drop across the inductive element(s)). During the first period, the first S&H circuit 512 may be configured to sample a first voltage (labeled "$V_1$") of the pin 250. At the end of the first period, the resistance detector 230 may be further configured to open the first switch 508, and the first S&H circuit 512 may be configured to hold the sampled first voltage. After the first period, the external capacitive element(s) may be discharged.

The resistance detector 230 (and more specifically, the control logic 502) may be further configured to close the second switch 510 at a beginning of a second period to provide the second current from the second current source 506 to the pin 250, generating voltages across the external resistive and capacitive elements as described above. The second period may have a time length $t_2$. During the second period, the second S&H circuit 514 may be configured to sample a second voltage (labeled "$V_2$") of the pin 250. At the end of the second period, the resistance detector 230 may be further configured to open the second switch 510, and the second S&H circuit 514 may be configured to hold the sampled second voltage. After the second period, the external capacitive element(s) may be discharged.

A time allotted to discharge the external capacitive element(s) may be determined based on a known value of a resistance of a pull-down network used to discharge the capacitive element(s), and an estimated range of values of the capacitance C L of the capacitor 340 in the lumped parameter model. Based on these values, the resistance-capacitance (RC) time constant may be estimated, and the resistance detector 230 may be configured to wait a corresponding amount of time to ensure that the external capacitive element(s) are practically discharged (e.g., substantially discharged to have a negligible effect for the purpose of resistance detection).

Based on this sequence described above, a voltage difference between the held first voltage and the held second voltage (e.g., "ΔVout") at the pin 250 can be represented as $$\Delta Vout = (I_1 - I_2) * R_p + \frac{I_1 * t_1 - I_2 * t_2}{C_L}$$

Therefore, a first product of a value of the first current and the time length (t 1) of the first period may be configured to be equal to a second product of a value of the second current and the time length ($t_2$) of the second period. That is, the currents and time periods may be set so that $I_1*t_1=I_2*t_2$. Accordingly, because $I_1*t_1=I_2*t_2$, the capacitance $C_L$ of the capacitor 340 in the lumped parameter model becomes negligible. That is, the voltage difference between the held first voltage and the held second voltage at the pin 250 may instead be approximated as ΔVout=$(I_1-I_2)*R_p$ The resistance detector 230 may be further configured to quantize, with the ADC 518, the voltage difference between the held first voltage and the held second voltage, and determine the resistance $R_p$ of the resistor 330 in the lumped parameter model based on the rearranged equation $$R_p = \frac{\Delta Vout}{(I_1 - I_2)}$$

According to certain aspects, the resistance detector 230 may further include an amplifier 516 having a first input coupled to the output of the first S&H circuit 512, a second input coupled to the output of the second S&H circuit 514, and an output coupled to the one or more inputs of the ADC 518. The amplifier 516 may be configured to amplify the voltage difference between the held first voltage and the held second voltage. In this case, the resistance detector 230 may be configured to quantize, with the ADC 518, the amplified voltage difference and determine the resistance R p of the resistor 330 in the lumped parameter model based on a value of the first current, a value of the second current, and the quantized amplified voltage difference.

Example Capacitance Detection Circuitry

Figure 6:
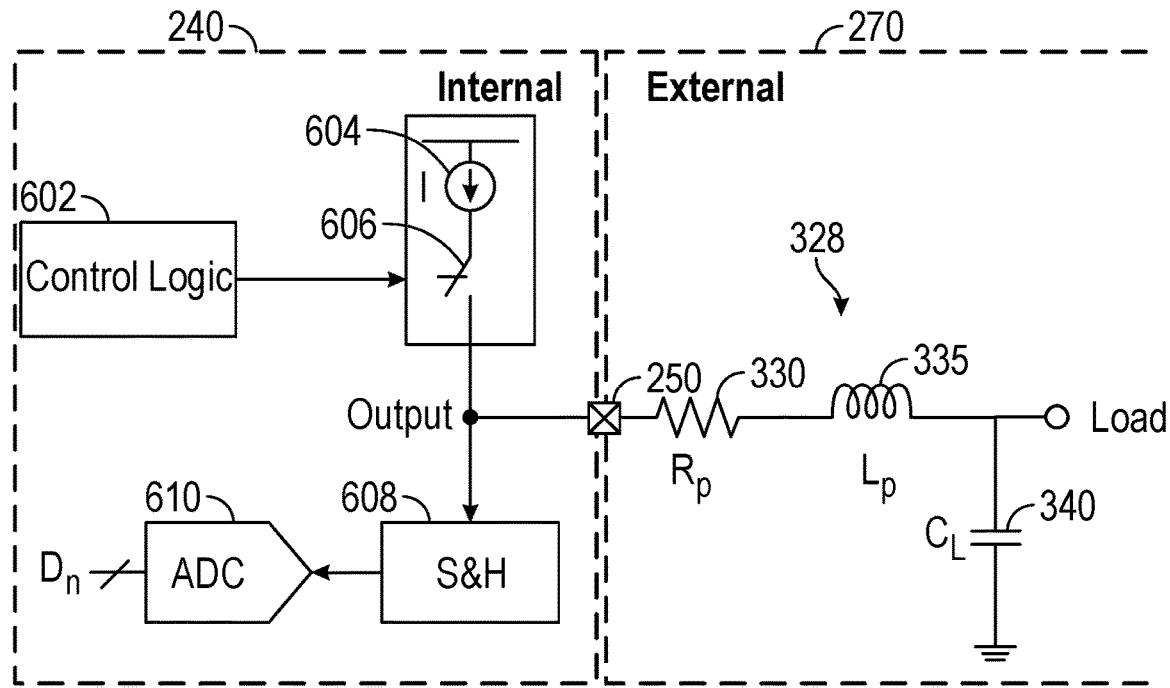
FIG. 6 illustrates an example implementation of a capacitance detector, in accordance with certain aspects of the present disclosure.
Figure 6:
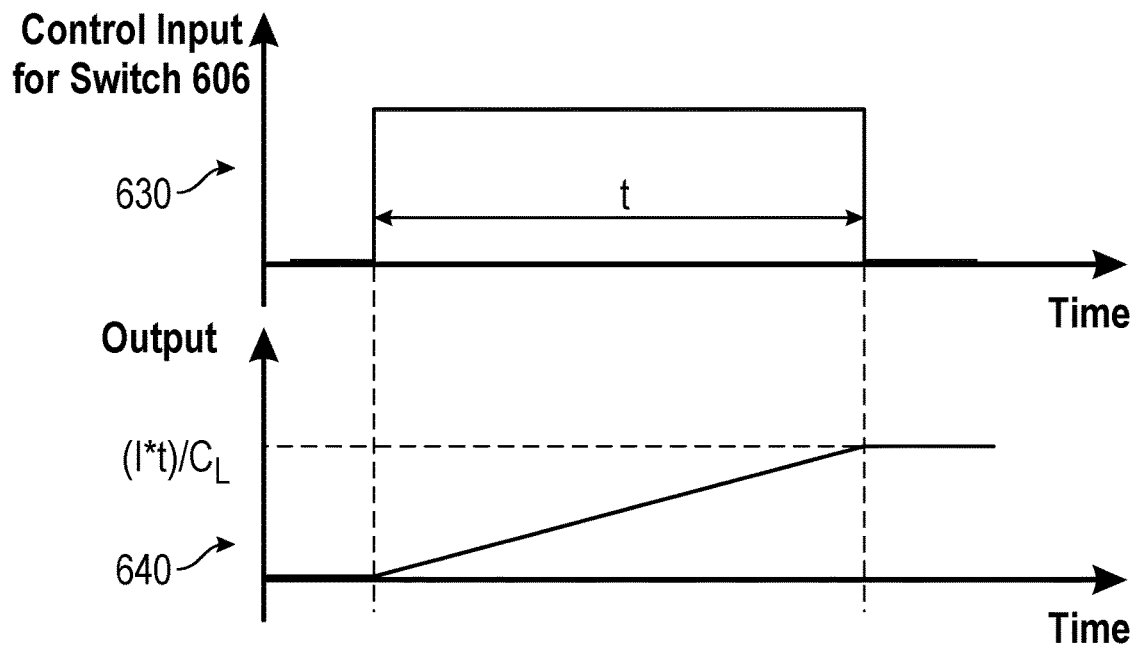

FIG. 6 illustrates an example capacitance detector 240, in accordance with certain aspects of the present disclosure. The capacitance detector 240 may be configured to determine a capacitance $C_L$ of the capacitor 340 in the lumped parameter model 328.

The capacitance detector 240 may include control logic 602, a current source 604, a switch 606, an S&H circuit 608, and an ADC 610. As shown, the current source 604 may be coupled between a power supply rail (e.g., power supply rail 308) and the switch 606, the switch 606 may be coupled between the current source 604 and the pin 250, and the S&H circuit 608 may be coupled between the pin 250 and the ADC 610. The current source 604 and/or the switch may each be implemented by one or more transistors, for example. The control logic 602 may have an output coupled to a control input of the switch 606.

The capacitance detector 240 (and more specifically, the control logic 602) may be configured to close the switch 606 at a beginning of a period to charge one or more capacitive elements external to the IC package, represented by the capacitor 340, with a current from the current source 604. This charging may be performed at lower frequencies, such that the capacitive element dominates, and the resistive and inductive elements in the lumped parameter model 328 have negligible effect. The capacitance detector 240 may be further configured to sample a voltage of the pin 250 during the period, hold the sampled voltage at the end of the period with the S&H circuit 608, and to open the switch 606 at the end of the period.

The capacitance detector 240 (and more specifically, the control logic 602) may also be configured to quantize the held voltage with the ADC 610, and determine the capacitance C L of the capacitor 340 in the lumped parameter model 328 based on a value of the current, a time length of the period, and the quantized voltage. For example, the capacitance detector 240 may be configured to determine the capacitance C L of the capacitor 340 in the lumped parameter model using the equation $$C_L = \frac{I * t}{V_C}$$

where I is the current from the current source 604, t is the time length of the period, and $V_C$ is the voltage sampled by the S&H circuit 608.

FIG. 6 also includes plots 630 and 640, which illustrate an input and output voltage, respectively, of the capacitance detector 240 with time before, during, and after the detection period. As illustrated in plot 630, a control input for the switch 606 may be changed from logic low to logic high, thereby closing the switch 606. While the switch 606 is closed, the one or more capacitive elements external to the IC package, represented by the capacitor 340, are charged by the current from the current source 604. The switch 606 is left closed for a length of time t, during which the voltage at the pin 250 (represented by the y-axis and labeled "Output" in the graph 640) increases and is sampled by the S&H circuit 608. At the end of the period, the switch 606 may be opened (as illustrated by the control input for the switch 606 being changed to logic low), and the S&H circuit 608 may hold the sampled voltage. The held voltage may then be quantized (e.g., by the ADC 610), and the quantized value may be used to calculate the capacitance C L of the capacitor 340 in the lumped parameter model based on the above equation.

Example Operations for Parameter Determination

FIG. 7 is a flow diagram of example operations 700 for determining parasitics and parameters of components external to an IC package (such as the IC package 205), in accordance with certain aspects of the present disclosure. The operations 700 may be performed using detection circuitry in an IC package, such as the detection circuitry 210 in the IC package 205 of FIG. 2.

The operations 700 may begin, at block 702, with coupling at least one of an inductance detector (e.g., the inductance detector 220), a resistance detector (e.g., the resistance detector 230), or a capacitance detector (e.g., the capacitance detector 240), internal to an IC package, to a pin (e.g., the pin 250) of the IC package. The pin may be coupled to a component external to the IC package (e.g., the external component(s) 270). At block 704, the operations 70 may further include detecting, using the at least one of the resistance detector, the inductance detector, or the capacitance detector internal to the IC package, at least one of a resistance, an inductance, or a capacitance, respectively, of a lumped parameter model (e.g., lumped parameter model 328) for the component external to the IC package and for parasitics (e.g., the parasitics 260) associated with at least one of the component, the pin, or a connection (e.g., connection 265) between the component and the pin.

According to certain aspects, the coupling at block 702 may involve closing one or more switches (e.g., the switches in the switch network 215) coupled between the pin and the at least one of the resistance detector, the inductance detector, or the capacitance detector.

According to certain aspects, the detecting at block 704 may involve operating the at least one of the resistance detector, the inductance detector, or the capacitance detector in the time domain. In certain aspects, the detecting at block 704 may involve generating (e.g., via the switch driver 304) a drive signal in the IC package, outputting the drive signal to the component via the pin of the IC package, and receiving a response signal from the component and the parasitics via the pin of the IC package. In this case, the drive signal may be a time-domain drive signal, and the response signal may be a time-domain response signal.

According to certain aspects, detecting the capacitance at block 704 may involve closing a switch (e.g., the switch 606) coupled between a current source (e.g., the current source 604) and the pin at a beginning of a period to charge a capacitive element (e.g., the capacitor CO in the lumped parameter model with a current from the current source, and opening the switch at an end of the period. In this case, detecting the capacitance may further involve sampling a voltage of the pin during the period with a sample-and-hold (S&H) circuit (e.g., the S&H circuit 608), and holding the sampled voltage at the end of the period with the S&H circuit. In certain aspects, detecting the capacitance may further involve quantizing the held voltage with an analog-to-digital converter (ADC) (e.g., the ADC 610), and determining the capacitance of the capacitive element in the lumped parameter model based on a value of the current, a time length of the period, and the quantized voltage.

According to certain aspects, detecting the resistance at block 704 may involve closing a first switch (e.g., the first switch 508), coupled between a first current source (e.g., the first current source 504) and the pin, at a beginning of a first period to provide a first current (e.g., $I_1$) from the first current source to the pin, and opening the first switch at an end of the first period. In certain aspects, detecting the resistance may further involve sampling a first voltage of the pin during the first period and holding the sampled first voltage at the end of the first period, with a first S&H circuit (e.g., S&H circuit 512). Detecting the resistance may also involve closing a second switch (e.g., the second switch 510), coupled between a second current source (e.g., the second current source 506) and the pin, at a beginning of a second period to provide a second current (e.g., 12) from the second current source to the pin, and opening the second switch at an end of the second period. In certain aspects, detecting the resistance may further involve sampling a second voltage of the pin during the second period and holding the sampled second voltage at the end of the second period, with a second S&H circuit (e.g., the S&H circuit 514). Detecting the resistance may further involve quantizing a voltage difference between the held first voltage and the held second voltage with an analog-to-digital converter (ADC) (e.g., the ADC 518), and determining the resistance of a resistive element (e.g., the resistor $R_p$) in the lumped parameter model based on a value of the first current, a value of the second current, and the quantized voltage difference. In this case, a first product of a value of the first current and a time length of the first period may be substantially equal to a second product of a value of the second current and a time length of the second period, such that the capacitance of the lumped parameter model becomes negligible.

In some aspects, detecting the resistance may further involve amplifying (e.g., with amplifier 516) the voltage difference between the held first voltage and the held second voltage. In this case, quantizing a voltage difference between the held first voltage and the held second voltage may involve quantizing the amplified voltage difference.

According to certain aspects, detecting the inductance at block 704 may involve using a successive-approximation register (SAR)-based charging scheme (e.g., using the SAR 316) to charge the component via the pin for a number of cycles. In certain aspects, detecting the inductance may involve generating a pulse with a pulse generator (e.g., the pulse generator 302), selecting a path from among a plurality of paths (e.g., the plurality of driving circuits 322) in a switch driver (e.g., the switch driver 304), modifying (e.g., via logic 318) a slew rate of the pulse with the selected path in the switch driver, and driving a switch (e.g., the switch 306) coupled between a power supply rail (e.g., the power supply rail 308) and the pin with the pulse having the modified slew rate. In certain aspects, detecting the inductance may further involve detecting (e.g., via the peak detector 310) a peak of a voltage signal received from the pin, comparing the detected peak of the voltage signal to a reference voltage (e.g., generated with the reference voltage generator 312) with a comparator (e.g., the comparator 314). In this case, detecting the inductance may involve storing a digital value output from the comparator in a successive approximation register (SAR) (e.g., the SAR 316). A plurality of digital values stored in the SAR may represent the inductance, after a number of cycles of driving the switch with different slew rates. In some aspects, selecting the path in the switch driver involves selecting the path from among the plurality of paths in the switch driver based on the plurality of digital values in the SAR.

According to certain aspects, the operations 700 may further involve selecting one or more parameters for the IC package, based on the detected at least one of the resistance, the inductance, or the capacitance of the lumped parameter model, and adjusting operation of one or more circuit components of the IC package, based on the selected one or more parameters.

Example Aspects

In addition to the various aspects described above, specific combinations of aspects are within the scope of the disclosure, some of which are detailed below:

Aspect 1: An integrated circuit (IC) package comprising: a pin for coupling to a component external to the IC package; and at least one of a resistance detector, an inductance detector, or a capacitance detector coupled to the pin and configured to detect at least one of a resistance, an inductance, or a capacitance, respectively, of a lumped parameter model for the component external to the IC package and for parasitics associated with at least one of the component, the pin, or a connection between the component and the pin.

Aspect 2: The IC package of Aspect 1, wherein the at least one of the resistance detector, the inductance detector, or the capacitance detector is configured to operate in the time domain.

Aspect 3: The IC package of Aspect 1 or 2, wherein the at least one of the resistance detector, the inductance detector, or the capacitance detector is configured to output a time-domain drive signal and to sense a time-domain response signal.

Aspect 4: The IC package of any of the preceding Aspects, further comprising one or more switches coupled between the pin and the at least one of the resistance detector, the inductance detector, or the capacitance detector.

Aspect 5: The IC package of any of the preceding Aspects, wherein the capacitance detector comprises: a current source; a switch coupled between the current source and the pin; an analog-to-digital converter (ADC); and a sample-and-hold circuit coupled between the pin and the ADC.

Aspect 6: The IC package of Aspect 5, wherein the capacitance detector is configured to: close the switch at a beginning of a period to charge a capacitive element in the lumped parameter model with a current from the current source; open the switch at an end of the period; sample a voltage of the pin during the period and hold the sampled voltage at the end of the period, with the sample-and-hold circuit; quantize the held voltage with the ADC; and determine the capacitance of the capacitive element in the lumped parameter model based on a value of the current, a time length of the period, and the quantized voltage.

Aspect 7: The IC package of any of the preceding Aspects, wherein the resistance detector comprises: a first current source configured to source a first current; a first switch coupled between the first current source and the pin; a second current source configured to source a second current, the second current being different from the first current; a second switch coupled between the second current source and the pin; a first sample-and-hold circuit having an input coupled to the pin; a second sample-and-hold circuit having an input coupled to the pin; and an ADC having one or more inputs coupled to an output of the first sample-and-hold circuit and to an output of the second sample-and-hold circuit.

Aspect 8: The IC package of Aspect 7, wherein the resistance detector is configured to: close the first switch at a beginning of a first period to provide the first current to the pin; open the first switch at an end of the first period; sample a first voltage of the pin during the first period and hold the sampled first voltage at the end of the first period, with the first sample-and-hold circuit; close the second switch at a beginning of a second period to provide the second current to the pin; open the second switch at an end of the second period; sample a second voltage of the pin during the second period and hold the sampled second voltage at the end of the second period, with the second sample-and-hold circuit; quantize a voltage difference between the held first voltage and the held second voltage with the ADC; and determine the resistance of a resistive element in the lumped parameter model based on a value of the first current, a value of the second current, and the quantized voltage difference.

Aspect 9: The IC package of Aspect 8, wherein a first product of a value of the first current and a time length of the first period is configured to be equal to a second product of a value of the second current and a time length of the second period (such that the capacitance of the lumped parameter model becomes negligible).

Aspect 10: The IC package of any of Aspects 7-9, wherein the resistance detector further comprises an amplifier having a first input coupled to the output of the first sample-and-hold circuit, having a second input coupled to the output of the second sample-and-hold circuit, and having an output coupled to the one or more inputs of the ADC.

Aspect 11: The IC package of Aspect 10, wherein the resistance detector is configured to: close the first switch at a beginning of a first period to provide the first current to the pin; open the first switch at an end of the first period; sample a first voltage of the pin during the first period and hold the sampled first voltage at the end of the first period, with the first sample-and-hold circuit; close the second switch at a beginning of a second period to provide the second current to the pin; open the second switch at an end of the second period; sample a second voltage of the pin during the second period and hold the sampled second voltage at the end of the second period, with the second sample-and-hold circuit; amplify a voltage difference between the held first voltage and the held second voltage with the amplifier; quantize the amplified voltage difference with the ADC; and determine the resistance of a resistive element in the lumped parameter model based on a value of the first current, a value of the second current, and the quantized voltage difference.

Aspect 12: The IC package of any of the preceding Aspects, wherein the inductance detector comprises: a pulse generator; a switch coupled between a power supply rail and the pin; and a switch driver coupled between an output of the pulse generator and a control input of the switch, the switch driver being configured to drive the switch with a plurality of different slew rates.

Aspect 13: The IC package of Aspect 12, wherein the inductance detector further comprises: a peak detector having an input coupled to the pin; a comparator having a first input coupled to an output of the peak detector and having a second input coupled to a reference voltage node; and a successive approximation register having an input coupled to an output of the comparator.

Aspect 14: The IC package of Aspect 13, wherein the peak detector comprises an AC-coupled diode peak detector.

Aspect 15: The IC package of Aspect 13 or 14, wherein the peak detector comprises: a first transistor having a drain coupled to the pin; a first capacitor coupled between the drain and a gate of the first transistor; and a second capacitor coupled between a source of the first transistor and a reference potential node of the peak detector.

Aspect 16: The IC package of Aspect 15, wherein the peak detector further comprises: a second transistor having a drain coupled to the source of the first transistor and having a source coupled to the second capacitor and to the first input of the comparator; a third transistor having a source coupled to a gate of the second transistor; a current source coupled between the power supply rail and a drain of the third transistor; and a fourth transistor having a drain coupled to the gate of the second transistor and the source of the third transistor and having a source coupled to the reference potential node of the peak detector.

Aspect 17: The IC package of Aspect 16, wherein the peak detector further comprises a switched capacitor array coupled between the gate of the second transistor and the reference potential node of the peak detector.

Aspect 18: The IC package of any of Aspects 13-17, wherein the switch driver comprises a plurality of drive circuits selectively coupled between the output of the pulse generator and the control input of the switch.

Aspect 19: The IC package of Aspect 18, further comprising logic having an input coupled to an output of the successive approximation register and having outputs coupled to control inputs of switches in the switch driver, the logic being configured to control selection of the drive circuits based on a digital value in the successive approximation register.

Aspect 20: The IC package of Aspect 18 or 19, wherein at least one of the plurality of drive circuits comprises a plurality of series-connected inverters.

Aspect 21: A method of parameter determination, comprising: coupling at least one of a resistance detector, an inductance detector, or a capacitance detector, internal to an IC package, to a pin of the IC package, the pin being coupled to a component external to the IC package; and detecting, using the at least one of the resistance detector, the inductance detector, or the capacitance detector internal to the IC package, at least one of a resistance, an inductance, or a capacitance, respectively, of a lumped parameter model for the component external to the IC package and for parasitics associated with at least one of the component, the pin, or a connection between the component and the pin.

Aspect 22: The method of Aspect 21, wherein the detecting comprises operating the at least one of the resistance detector, the inductance detector, or the capacitance detector in the time domain.

Aspect 23: The method of Aspect 21 or 22, wherein the detecting comprises: generating a drive signal in the IC package; outputting the drive signal to the component via the pin of the IC package; and receiving a response signal from the component and the parasitics via the pin of the IC package.

Aspect 24: The method of Aspect 23, wherein the drive signal is a time-domain drive signal and wherein the response signal is a time-domain response signal.

Aspect 25: The method of any of Aspects 21-24, wherein the coupling comprises closing one or more switches coupled between the pin and the at least one of the resistance detector, the inductance detector, or the capacitance detector.

Aspect 26: The method of any of Aspects 21-25, wherein detecting the capacitance comprises: closing a switch coupled between a current source and the pin at a beginning of a period to charge a capacitive element in the lumped parameter model with a current from the current source; opening the switch at an end of the period; sampling a voltage of the pin during the period with a sample-and-hold circuit; holding the sampled voltage at the end of the period with the sample-and-hold circuit; quantizing the held voltage with an ADC; and determining the capacitance of the capacitive element in the lumped parameter model based on a value of the current, a time length of the period, and the quantized voltage.

Aspect 27: The method of any of Aspects 21-26, wherein detecting the resistance comprises: closing a first switch, coupled between a first current source and the pin, at a beginning of a first period to provide a first current from the first current source to the pin; opening the first switch at an end of the first period; sampling a first voltage of the pin during the first period and holding the sampled first voltage at the end of the first period, with a first sample-and-hold circuit; closing a second switch, coupled between a second current source and the pin, at a beginning of a second period to provide a second current from the second current source to the pin; opening the second switch at an end of the second period; sampling a second voltage of the pin during the second period and holding the sampled second voltage at the end of the second period, with a second sample-and-hold circuit; quantizing a voltage difference between the held first voltage and the held second voltage with an ADC; and determining the resistance of a resistive element in the lumped parameter model based on a value of the first current, a value of the second current, and the quantized voltage difference.

Aspect 28: The method of Aspect 27, wherein a first product of a value of the first current and a time length of the first period is substantially equal to a second product of a value of the second current and a time length of the second period such that the capacitance of the lumped parameter model becomes negligible.

Aspect 29: The method of Aspect 27 or 28, wherein detecting the resistance further comprises amplifying the voltage difference between the held first voltage and the held second voltage and wherein the quantizing comprises quantizing the amplified voltage difference.

Aspect 30: The method of any of Aspects 21-29, wherein detecting the inductance comprises using a SAR-based charging scheme to charge the component via the pin for a number of cycles.

Aspect 31: The method of any of Aspects 21-30, wherein detecting the inductance comprises: generating a pulse with a pulse generator; selecting a path from among a plurality of paths in a switch driver; modifying a slew rate of the pulse with the selected path in the switch driver; and driving a switch coupled between a power supply rail and the pin with the pulse having the modified slew rate.

Aspect 32: The method of Aspect 31, wherein detecting the inductance further comprises: detecting a peak of a voltage signal received from the pin; comparing the detected peak of the voltage signal to a reference voltage with a comparator; and storing a digital value output from the comparator in a successive approximation register, wherein a plurality of digital values stored in the successive approximation register represent the inductance, after a number of cycles of driving the switch with different slew rates.

Aspect 33: The method of Aspect 32, wherein the selecting comprises selecting the path from among the plurality of paths in the switch driver based on the plurality of digital values in the successive approximation register.

Aspect 34: The method of any of Aspects 21-33, further comprising: selecting one or more parameters for the IC package, based on the detected at least one of the resistance, the inductance, or the capacitance of the lumped parameter model; and adjusting operation of one or more circuit components of the IC package, based on the selected one or more parameters.

Aspect 35: An IC package comprising: a pin for coupling to a component external to the IC package; and at least one of means for detecting resistance, means for detecting inductance, or means for detecting capacitance, of a lumped parameter model for the component external to the IC package and for parasitics associated with at least one of the component, the pin, or a connection between the component and the pin.

Aspect 36: The IC package of Aspect 35, further comprising means for selectively coupling, to the pin of the IC package, the at least one of the means for detecting resistance, the means for detecting inductance, or the means for detecting capacitance.

Aspect 37: The IC package of Aspect 35 or 36, wherein the at least one of the means for detecting resistance, the means for detecting inductance, or the means for detecting capacitance is configured to output a time-domain drive signal and to sense a time-domain response signal.

ADDITIONAL CONSIDERATIONS

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

For example, means for detecting resistance may include a resistance detector, such as the resistance detector 230 illustrated in FIGS. 2 and 5. Means for detecting inductance may include an inductance detector, such as the inductance detector 220 depicted in FIGS. 2 and 3. Means for detecting capacitance may include a capacitance detector, such as the capacitance detector 240 portrayed in FIGS. 2 and 6. Means for selectively coupling may include one or more switches, such as the switch network 215 shown in FIG. 2.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation, and details of the methods and apparatus described above without departing from the scope of the claims.

What is claimed is:

1. An integrated circuit (IC) package comprising:
   a pin for coupling to a component external to the IC package; and
   at least one of a resistance detector, an inductance detector, or a capacitance detector coupled to the pin and configured to detect at least one of a resistance, an inductance, or a capacitance, respectively, of a lumped parameter model for the component external to the IC package and for parasitics associated with at least one of the component, the pin, or a connection between the component and the pin, wherein the capacitance detector includes a current source, a switch coupled between the current source and the pin, an analog-to-digital converter (ADC), and a sample-and-hold circuit coupled between the pin and the ADC.

2. The IC package of claim 1, wherein the at least one of the resistance detector, the inductance detector, or the capacitance detector is configured to operate in the time domain.

3. The IC package of claim 1, wherein the at least one of the resistance detector, the inductance detector, or the capacitance detector is configured to output a time-domain drive signal and to sense a time-domain response signal.

4. The IC package of claim 1, further comprising one or more switches coupled between the pin and the at least one of the resistance detector, the inductance detector, or the capacitance detector.

5. The IC package of claim 1, wherein the capacitance detector is configured to:
   close the switch at a beginning of a period to charge a capacitive element in the lumped parameter model with a current from the current source;
   open the switch at an end of the period;
   sample a voltage of the pin during the period and hold the sampled voltage at the end of the period, with the sample-and-hold circuit;
   quantize the held voltage with the ADC; and
   determine the capacitance of the capacitive element in the lumped parameter model based on a value of the current, a time length of the period, and the quantized voltage.

6. The IC package of claim 1, wherein the resistance detector comprises:
   a first current source configured to source a first current;
   a first switch coupled between the first current source and the pin;
   a second current source configured to source a second current, the second current being different from the first current;
   a second switch coupled between the second current source and the pin;
   a first sample-and-hold circuit having an input coupled to the pin;
   a second sample-and-hold circuit having an input coupled to the pin; and
   an analog-to-digital converter (ADC) having one or more inputs coupled to an output of the first sample-and-hold circuit and to an output of the second sample-and-hold circuit.

7. The IC package of claim 6, wherein the resistance detector is configured to:
   close the first switch at a beginning of a first period to provide the first current to the pin;
   open the first switch at an end of the first period;
   sample a first voltage of the pin during the first period and hold the sampled first voltage at the end of the first period, with the first sample-and-hold circuit;
   close the second switch at a beginning of a second period to provide the second current to the pin;
   open the second switch at an end of the second period;
   sample a second voltage of the pin during the second period and hold the sampled second voltage at the end of the second period, with the second sample-and-hold circuit;
   quantize a voltage difference between the held first voltage and the held second voltage with the ADC; and
   determine the resistance of a resistive element in the lumped parameter model based on a value of the first current, a value of the second current, and the quantized voltage difference.

8. The IC package of claim 7, wherein a first product of a value of the first current and a time length of the first period is configured to be equal to a second product of a value of the second current and a time length of the second period.

9. The IC package of claim 6, wherein the resistance detector further comprises an amplifier having a first input coupled to the output of the first sample-and-hold circuit, having a second input coupled to the output of the second sample-and-hold circuit, and having an output coupled to the one or more inputs of the ADC.

10. The IC package of claim 9, wherein the resistance detector is configured to:
close the first switch at a beginning of a first period to provide the first current to the pin;
open the first switch at an end of the first period;
sample a first voltage of the pin during the first period and hold the sampled first voltage at the end of the first period, with the first sample-and-hold circuit;
close the second switch at a beginning of a second period to provide the second current to the pin;
open the second switch at an end of the second period;
sample a second voltage of the pin during the second period and hold the sampled second voltage at the end of the second period, with the second sample-and-hold circuit;
amplify a voltage difference between the held first voltage and the held second voltage with the amplifier;
quantize the amplified voltage difference with the ADC; and
determine the resistance of a resistive element in the lumped parameter model based on a value of the first current, a value of the second current, and the quantized voltage difference.

11. The IC package of claim 1, wherein the inductance detector comprises:
a pulse generator;
a switch coupled between a power supply rail and the pin; and
a switch driver coupled between an output of the pulse generator and a control input of the switch, the switch driver being configured to drive the switch with a plurality of different slew rates.

12. The IC package of claim 11, wherein the inductance detector further comprises:
a peak detector having an input coupled to the pin;
a comparator having a first input coupled to an output of the peak detector and having a second input coupled to a reference voltage node; and
a successive approximation register having an input coupled to an output of the comparator.

13. The IC package of claim 12, wherein the peak detector comprises an AC-coupled diode peak detector.

14. The IC package of claim 12, wherein the peak detector comprises:
a first transistor having a drain coupled to the pin;
a first capacitor coupled between the drain and a gate of the first transistor; and
a second capacitor coupled between a source of the first transistor and a reference potential node of the peak detector.

15. The IC package of claim 14, wherein the peak detector further comprises:
a second transistor having a drain coupled to the source of the first transistor and having a source coupled to the second capacitor and to the first input of the comparator;
a third transistor having a source coupled to a gate of the second transistor;
a current source coupled between the power supply rail and a drain of the third transistor; and
a fourth transistor having a drain coupled to the gate of the second transistor and the source of the third transistor and having a source coupled to the reference potential node of the peak detector.

16. The IC package of claim 15, wherein the peak detector further comprises a switched capacitor array coupled between the gate of the second transistor and the reference potential node of the peak detector.

17. The IC package of claim 12, wherein the switch driver comprises a plurality of drive circuits selectively coupled between the output of the pulse generator and the control input of the switch.

18. The IC package of claim 17, further comprising logic having an input coupled to an output of the successive approximation register and having outputs coupled to control inputs of switches in the switch driver, the logic being configured to control selection of the drive circuits based on a digital value in the successive approximation register.

19. The IC package of claim 17, wherein at least one of the plurality of drive circuits comprises a plurality of series-connected inverters.

20. A method of parameter determination, comprising:
coupling at least one of a resistance detector, an inductance detector, or a capacitance detector, internal to an integrated circuit (IC) package, to a pin of the IC package, the pin being coupled to a component external to the IC package;
detecting, using the at least one of the resistance detector, the inductance detector, or the capacitance detector internal to the IC package, at least one of a resistance, an inductance, or a capacitance, respectively, of a lumped parameter model for the component external to the IC package and for parasitics associated with at least one of the component, the pin, or a connection between the component and the pin; and
wherein detecting the capacitance comprises:
closing a switch coupled between a current source and the pin at a beginning of a period to charge a capacitive element in the lumped parameter model with a current from the current source;
opening the switch at an end of the period;
sampling a voltage of the pin during the period with a sample-and-hold circuit;
holding the sampled voltage at the end of the period with the sample-and-hold circuit;
quantizing the held voltage with an analog-to-digital converter (ADC); and
determining the capacitance of the capacitive element in the lumped parameter model based on a value of the current, a time length of the period, and the quantized voltage.

21. The method of claim 20, wherein the detecting comprises operating the at least one of the resistance detector, the inductance detector, or the capacitance detector in the time domain.

22. The method of claim 20, wherein the detecting comprises:
generating a drive signal in the IC package;
outputting the drive signal to the component via the pin of the IC package; and
receiving a response signal from the component and the parasitics via the pin of the IC package.

23. The method of claim 22, wherein the drive signal is a time-domain drive signal and wherein the response signal is a time-domain response signal.

24. The method of claim 20, wherein the coupling comprises closing one or more switches coupled between the pin and the at least one of the resistance detector, the inductance detector, or the capacitance detector.

25. The method of claim 20, wherein detecting the resistance comprises:

closing a first switch, coupled between a first current source and the pin, at a beginning of a first period to provide a first current from the first current source to the pin;

opening the first switch at an end of the first period;

sampling a first voltage of the pin during the first period and holding the sampled first voltage at the end of the first period, with a first sample-and-hold circuit;

closing a second switch, coupled between a second current source and the pin, at a beginning of a second period to provide a second current from the second current source to the pin;

opening the second switch at an end of the second period;

sampling a second voltage of the pin during the second period and holding the sampled second voltage at the end of the second period, with a second sample-and-hold circuit;

quantizing a voltage difference between the held first voltage and the held second voltage with an analog-to-digital converter (ADC); and determining the resistance of a resistive element in the lumped parameter model based on a value of the first current, a value of the second current, and the quantized voltage difference.

26. The method of claim 25, wherein a first product of a value of the first current and a time length of the first period is substantially equal to a second product of a value of the second current and a time length of the second period such that the capacitance of the lumped parameter model becomes negligible.

27. The method of claim 25, wherein detecting the resistance further comprises amplifying the voltage difference between the held first voltage and the held second voltage and wherein the quantizing comprises quantizing the amplified voltage difference.

28. The method of claim 20, wherein detecting the inductance comprises using a successive-approximation register (SAR)-based charging scheme to charge the component via the pin for a number of cycles.

29. The method of claim 20, wherein detecting the inductance comprises:
generating a pulse with a pulse generator;
selecting a path from among a plurality of paths in a switch driver;
modifying a slew rate of the pulse with the selected path in the switch driver; and
driving a switch coupled between a power supply rail and the pin with the pulse having the modified slew rate.

30. The method of claim 29, wherein detecting the inductance further comprises:
detecting a peak of a voltage signal received from the pin;
comparing the detected peak of the voltage signal to a reference voltage with a comparator; and
storing a digital value output from the comparator in a successive approximation register, wherein a plurality of digital values stored in the successive approximation register represent the inductance, after a number of cycles of driving the switch with different slew rates.

31. The method of claim 30, wherein the selecting comprises selecting the path from among the plurality of paths in the switch driver based on the plurality of digital values in the successive approximation register.

32. The method of claim 20, further comprising:
selecting one or more parameters for the IC package, based on the detected at least one of the resistance, the inductance, or the capacitance of the lumped parameter model; and
adjusting operation of one or more circuit components of the IC package, based on the selected one or more parameters.

* * * * *